US012777851B2

(12) United States Patent
Ryan et al.

(10) Patent No.: US 12,777,851 B2
(45) Date of Patent: Oct. 27, 2026

(54) BILAYER ENCAPSULATION OF A MEMORY CELL

(71) Applicant: Intel Corporation, Santa Clara, CA (US)

(72) Inventors: Errol Todd Ryan, Albuquerque, NM (US); Kyuchul Chong, Rio Rancho, NM (US); David M. Fryauf, Rio Rancho, NM (US); Zhiguo Sun, Albuquerque, NM (US)

(73) Assignee: Intel Corporation, Santa Clara, CA (US)

(*) Notice: Subject to any disclaimer, the term of this patent is extended or adjusted under 35 U.S.C. 154(b) by 222 days.

(21) Appl. No.: 17/750,231

(22) Filed: May 20, 2022

(65) Prior Publication Data

US 2023/0380307 A1 Nov. 23, 2023

(51) Int. Cl.
*H10N 70/00* (2023.01)
*H10B 63/00* (2023.01)

(52) U.S. Cl.
CPC ........... *H10N 70/801* (2023.02); *H10B 63/84* (2023.02); *H10N 70/011* (2023.02)

(58) Field of Classification Search
CPC ............... H10N 70/801; H10N 70/011; H10N 70/8413; H10N 70/231; H10N 70/826; H10N 70/20; H10B 63/84; H10B 63/10; H10B 63/24
See application file for complete search history.

(56) References Cited

U.S. PATENT DOCUMENTS

| | | | | |
|---|---|---|---|---|
| 2018/0061891 A1* | 3/2018 | Yoon | ...................... | H10B 63/80 |
| 2019/0043807 A1* | 2/2019 | Redaelli | ................. | H10B 63/80 |
| 2022/0113892 A1 | 4/2022 | Fugazza et al. | | |
| 2022/0310909 A1* | 9/2022 | Maldonado-Garcia | ...................... | H10B 63/24 |
| 2023/0171967 A1* | 6/2023 | Dong | ..................... | H10B 63/80 257/427 |

OTHER PUBLICATIONS

U.S. Appl. No. 17/561,385, filed Dec. 23, 2021 entitled, Reliable Electrode for Memory Cells (57 pages).
U.S. Appl. No. 17/682,907, filed Feb. 28, 2022 entitled, Metal Silicide Layer for Memory Array (56 pages).

* cited by examiner

*Primary Examiner* — Moazzam Hossain
(74) *Attorney, Agent, or Firm* — Alliance IP, LLC

(57) ABSTRACT

A memory device comprising a memory cell comprising a storage element including a phase change memory; and a bilayer formed on a first side and a second side of the memory cell, the bilayer including an inner layer comprising a first nitride and an outer layer comprising a second nitride.

23 Claims, 8 Drawing Sheets

BILAYER ENCAPSULATION OF A MEMORY CELL

FIELD

The present disclosure relates in general to the field of computer development, and more specifically, to bi-layer encapsulation of a memory cell.

BACKGROUND

A storage device may include non-volatile memory, such as multi-stack 3D crosspoint memory arrays. Memory cells of the memory arrays may be programmed via access lines (e.g., wordlines and bitlines) of the memory array.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
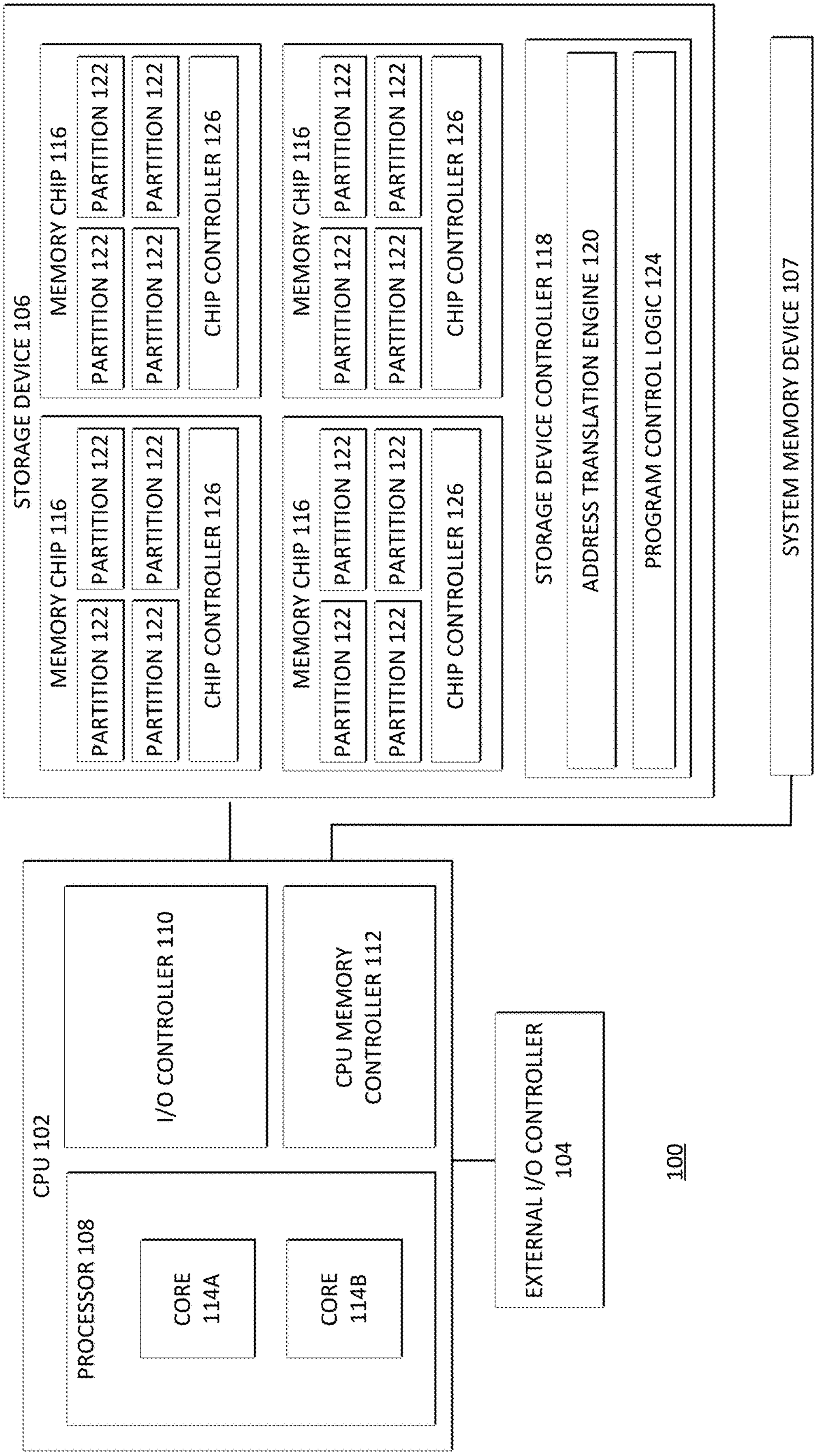
FIG. 1 illustrates components of a computer system in accordance with certain embodiments.

FIG. 1 illustrates components of a computer system 100 in accordance with certain embodiments. System 100 includes a central processing unit (CPU) 102 coupled to an external input/output (I/O) controller 104, a storage device 106 such as a solid state drive (SSD) or a dual inline memory module (DIMM), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 may include a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid.

Figure 3:
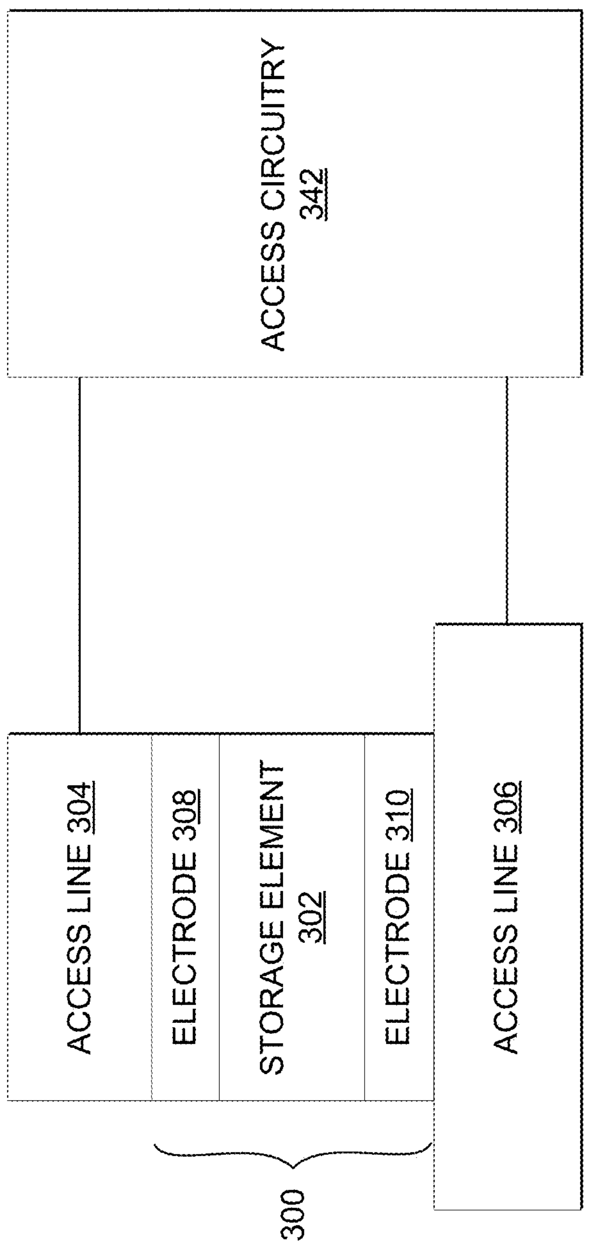
FIG. 3 illustrates a memory cell coupled to access circuitry in accordance with certain embodiments.
Figure 4:
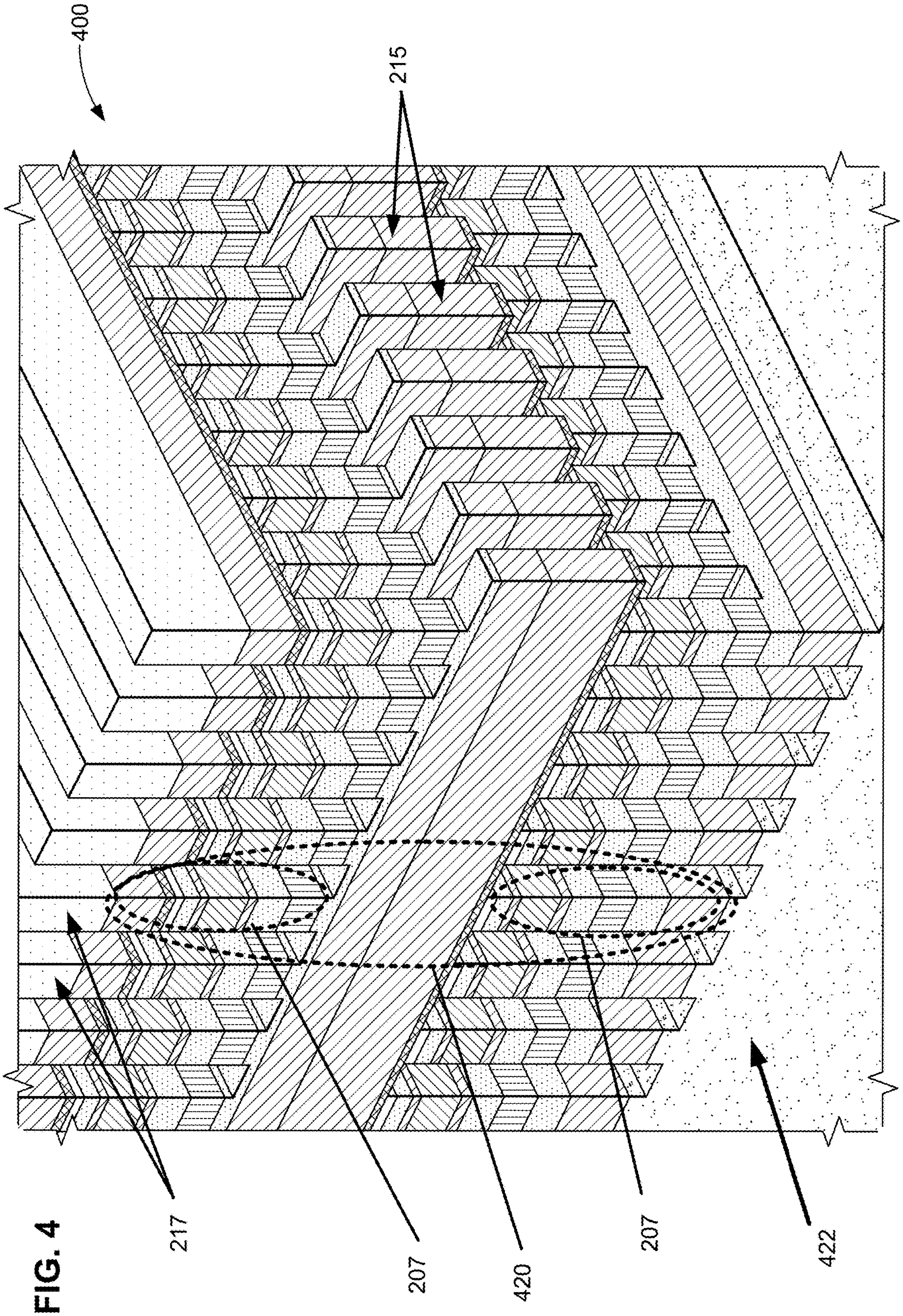
FIG. 4 is a perspective view of portions of a three dimensional (3D) crosspoint memory stack in accordance with certain embodiments.
Figure 5:
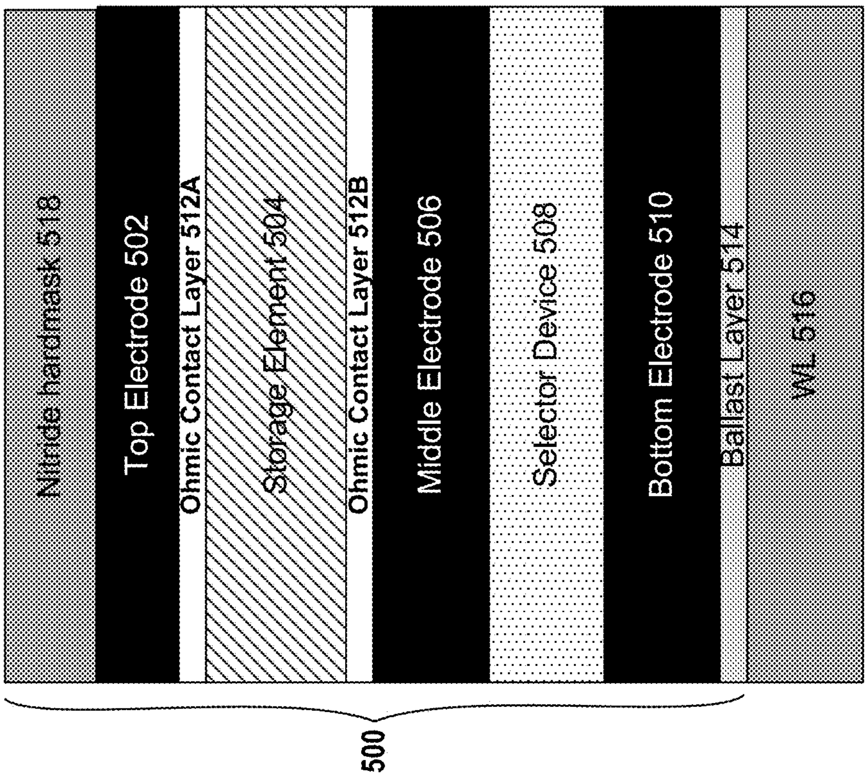
FIG. 5 is a cross section view of a portion of a memory array in accordance with certain embodiments.

Referring to FIGS. 3-5, in some memories (e.g., 3D crosspoint memory arrays), a memory cell may comprise a storage element coupled between electrodes coupled to distinct access lines (e.g., a wordline (WL) and bitline (BL)).

The electrodes and storage element may be part of a memory cell. In some embodiments, the memory cell may comprise a phase change material, such as a chalcogenide material. In general, a chalcogenide thermo-electric device (such as a memory cell or other suitable device) may require a highly conformal, hermetic encapsulation in order to prevent the device from being damaged from subsequent nanofabrication steps. In some embodiments, the encapsulation material may be silicon nitride (SiN). Chalcogenide device materials may impose very low thermal budgets that limit chemical vapor deposition (CVD) and atomic layer deposition (ALD) deposition to a relatively low temperature (e.g., <350° C.), which makes it difficult to deposit high quality encapsulation films. Pulsed plasma enhanced chemical vapor deposition (PECVD) may provide decent conformality (a measure of how closely the deposited material matches the shape of the structure on which the material is deposited). However, as device dimensions shrink, higher conformality may be required. Pulsed PECVD conformality becomes worse in high aspect ratio trenches as the film grows thicker because film growth at the bottom of the trench is limited by precursor diffusion. ALD deposition provides improved conformality, and plasma enhanced ALD (PEALD) may be used to deposit high quality SiN with sufficient conformality at the low temperatures required by chalcogenide materials. However, the plasmas used in PEALD deposition may damage the chalcogenide materials due to longer plasma exposure time and higher plasma powers relative to pulsed plasma CVD of SiN. For example, damage of the chalcogenide materials may result in redistribution of elements in the sidewall of the memory cell.

Various embodiments of the present disclosure provide a bilayer encapsulation process in which a very thin layer of material is deposited over the memory cell and then a thicker layer of material is deposited over the very thin layer to form a hermetic seal around the memory cell. The bilayer may protect the memory cell (or other device) during subsequent nanofabrication steps.

Various embodiments of the present disclosure may provide one or more technical advantages. For example, the bilayer encapsulation may have improved conformality without damaging the material (e.g., chalcogenide) of the memory cell (or other encapsulated device). In some embodiments, the thin layer of the bilayer encapsulation may protect the memory cell from PEALD plasma damage, which may enable the use of a material (e.g., SiN) deposited using PEALD as the outer encapsulation layer.

Returning again to FIG. 1, CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices. In other embodiments, the I/O controller 110 may be on a different chip from the CPU 102. I/O devices may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise a storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. Nonlimiting examples of nonvolatile memory may include any or a combination of: 3D crosspoint memory, phase change memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a disk drive (e.g., a solid state drive); a memory card; a Universal Serial Bus (USB) drive; a Dual In-line Memory Module (DIMM), such as a Non-Volatile DIMM (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. In some embodiments, a system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC engine). In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g., cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
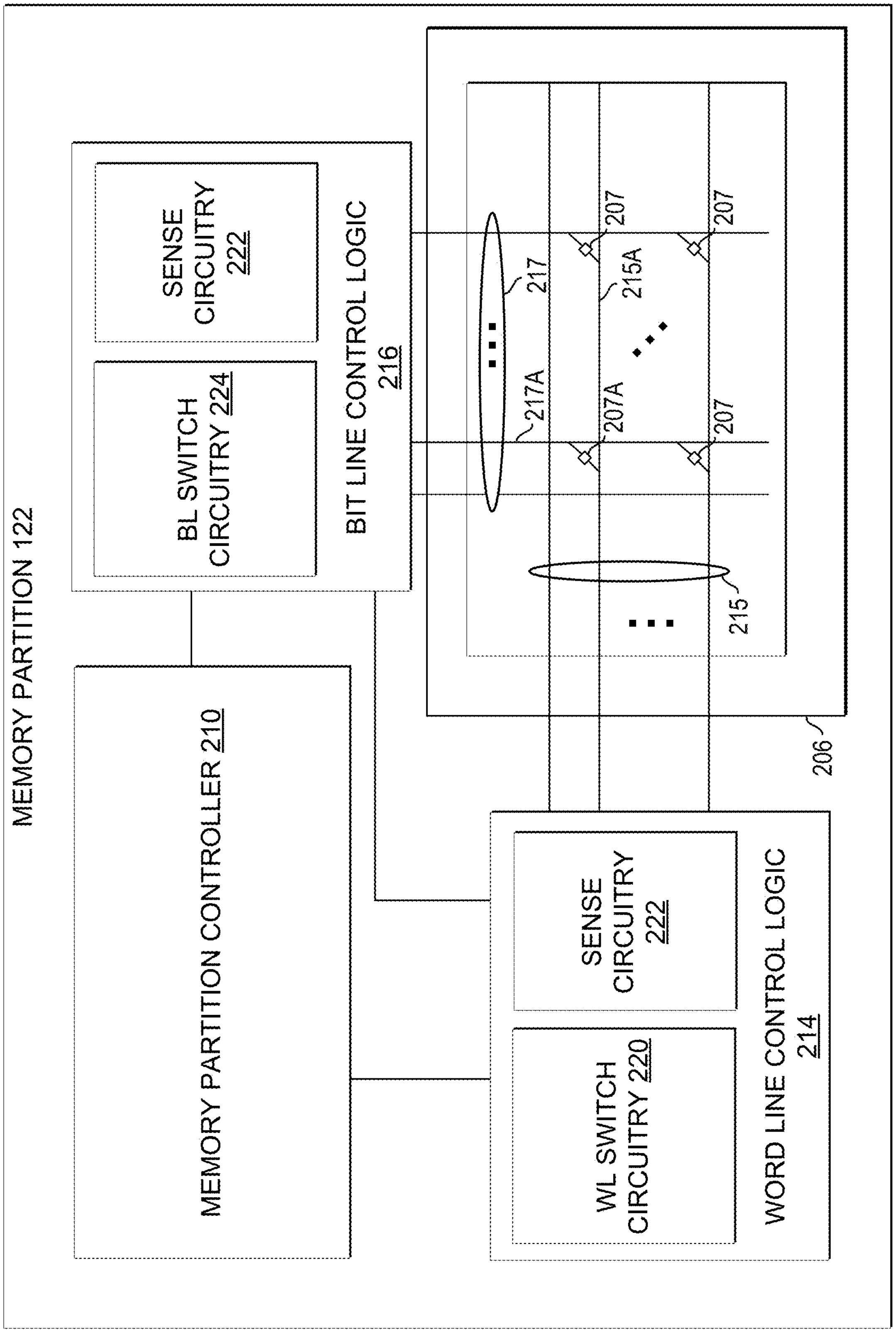
FIG. 2 illustrates a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In some embodiments, a 3D crosspoint memory array 206 may comprise a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called wordlines (WLs) and bitlines (BLs), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a wordline may cross over a bitline located beneath the wordline and another bitline for another memory cell located above the wordline. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell.

FIG. 2 illustrates a memory partition in accordance with certain embodiments. In the embodiment of FIG. 2, a memory partition 122 includes memory partition controller 210, wordline control logic 214, bitline control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with wordline control logic 214 and bitline control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of wordlines 215, a plurality of bitlines 217 and a plurality of memory cells, e.g., memory cells 207. Each memory cell is coupled between a wordline ("WL") and a bitline ("BL") at a crosspoint of the WL and the BL.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage (e.g., a neutral bias voltage) to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A.

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage (e.g., a neutral bias voltage) to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read VDM. VDM may induce a current (icell) in the memory cell 207A dependent on a program state of the memory cell. A comparator such as a sense amplifier may compare icell with a reference current in order to read a logic state of the memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, in one embodiment, 128 memory cells may be sensed at one time by sense amplifiers of the sense circuitry 222.

FIG. 3 illustrates a memory cell 300 coupled to access circuitry 342 in accordance with certain embodiments. The memory cell 300 includes a storage element 302 between access lines 304 and 306. The access lines 304, 306 electrically couple the memory cell 300 with access circuitry 342 that writes to and reads the memory cell 300. For example, access circuitry 342 may include WL switch circuitry 220, BL switch circuitry 224, sense circuitry 222, or other suitable circuitry.

In one embodiment, storage element 302 includes a self-selecting material that exhibits memory effects. A self-selecting material is a material that enables selection of a memory cell in an array without requiring a separate selector element (also referred to herein as selector device). Thus, storage element 302 may represent a "selector/storage material." A material exhibits memory effects if circuitry (e.g., 342) for accessing memory cells can cause the material to be in one of multiple states (e.g., via a write operation) and later determine the programmed state (e.g., via a read operation). Access circuitry 342 can store information in the memory cell 300 by causing the storage element 302 to be in a particular state. The storage element 302 can include, for example, a chalcogenide material or other material capable of functioning as both a storage element and a selector, to enable addressing a specific memory cell and determining what the state of the memory cell is. Thus, in one embodiment, the memory cell 300 is a self-selecting memory cell that includes a single layer of material that acts as both a selector element to select the memory cell and a memory element to store a logic state. In the embodiment depicted, each memory cell 300 is a two-terminal device (i.e., the memory cell 300 has two electrodes to receive control signals sufficient to write to and read from the memory cell 300).

In other embodiments, each memory cell (e.g., 300) includes a memory element configured to store information and a separate memory cell select device (e.g., selector) coupled to the memory element. Select devices may include ovonic threshold switches, diodes, bipolar junction transistors, field-effect transistors, etc. In one embodiment, a first chalcogenide layer may comprise the memory element and a second chalcogenide layer may comprise the select device.

The storage element 302 may include any suitable material programmable to a plurality of states. In some embodiments, the storage element 302 may include a chalcogenide material comprising a chemical compound with at least one chalcogen ion, that is, an element from group 16 of the periodic table. For example, the storage element 302 may include one or more of: sulfur (S), selenium (Se), or tellurium (Te). Additionally or alternatively, in various embodiments, storage element 302 may comprise germanium (Ge), antimony (Sb), bismuth (Bi), lead (Pb), tin (Sn), indium (In), silver (Ag), arsenic (As), phosphorus (P), molybdenum (Mo), gallium (Ga), aluminum (Al), oxygen (O), nitrogen (N), chromium (Cr), gold (Au), niobium (Nb), palladium (Pd), cobalt (Co), vanadium (V), nickel (Ni), platinum (Pt), titanium (Ti), tungsten (W), tantalum (Ta), or other materials. In various examples, the storage element 302 may include one or more chalcogenide materials such as such as Te—Se, Ge—Te, In—Se, Sb—Te, Ta—Sb—Te, As—Te, As—Se, Al—Te, As—Se—Te, Ge—Sb—Te, Ge—As—Se, Te—Ge—As, V—Sb—Se, Nb—Sb—Se, In—Sb—Te, In—Se—Te, Te—Sn—Se, V—Sb—Te, Se—Te—Sn, Ge—Se—Ga, Mo—Sb—Se, Cr—Sb—Se, Ta—Sb—Se, Bi—Se—Sb, Mo—Sb—Te, Ge—Bi—Te, W—Sb—Se, Ga—Se—Te, Ge—Te—Se, Cr—Sb—Te, Sn—Sb—Te, W—Sb—Te, As—Sb—Te, Ge—Te—Ti, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Se—Te—In, As—Ge—Sb—Te, Se—As—Ge—In, Ge—Sb—Se—Te, Ge—Sn—Sb—Te, Ge—Te—Sn—Ni, Ge—Te—Sn—Pd, and Ge—Te—Sn—Pt, Si—Ge—As—Se, In—Sn—Sb—Te, Ge—Se—Te—Si, Si—Te—As—Ge, Ag—In—Sb—Te, Ge—Se—Te—In—Si, or Se—As—Ge—Si—In. In other various examples, storage element 302 may include other materials capable of being programmed to one of multiple states, such as Ge—Sb, Ga—Sb, In—Sb, Sn—Sb—Bi, or In—Sb—Ge. One or more elements in a chalcogenide material (or other material used as storage element 302) may be dopants. For example, the storage element 302 may include dopants such as: aluminum (Al), oxygen (O), nitrogen (N), silicon (Si), carbon (C), boron (B), zirconium (Zr), hafnium (Hf), or a combination thereof. In some embodiments, the chalcogenide material (or other material used as storage element 302) may include additional elements such as hydrogen (H), oxygen (O), nitrogen (N), chlorine (Cl), or fluorine (F), each in atomic or molecular forms. The storage element 302 may include other materials or dopants not explicitly listed. In some examples, the storage element (such as any of the materials described above) is a phase change material. In other examples, the storage element 302 is not a phase change material, e.g., can be in one or multiple stable states (or transition between stable states) without a change in phase.

In some embodiments, a selector element coupled to storage material (e.g., in non-self-selecting memory cells) may also include a chalcogenide material. A selector device having a chalcogenide material can sometimes be referred to as an Ovonic Threshold Switch (OTS). An OTS may include a chalcogenide composition including any one of the chalcogenide alloy systems described above for the storage element and may further include an element that can suppress crystallization, such as arsenic (As), nitrogen (N), or carbon (C), to name a few. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

In some embodiments, an element from column III of the periodic table ("Group III element") may be introduced into a chalcogenide material composition to limit the presence of another material (e.g., Ge) in the selector device. For example, a Group III element may replace some or all of the other material (e.g., Ge) in the composition of the selector device. In some embodiments, a Group III element may form a stable, Group III element-centered tetrahedral bond structure with other elements (e.g., Se, As, and/or Si). Incorporating a Group III element into the chalcogenide material composition may stabilize the selector device to allow for technology scaling and increased cross point technology development (e.g., three-dimensional cross point architectures, RAM deployments, storage deployments, or the like).

In one embodiment, each selector device comprises a chalcogenide material having a composition of Se, As, and at least one of B, Al, Ga, In, and Tl. In some cases, the composition of the chalcogenide material comprises Ge or Si, or both.

In one example, the storage material is capable of switching between two or more stable states without changing phase (in other examples the storage material may switch between two stable states by changing phase). In one such embodiment, the access circuitry 342 programs the memory cell 300 by applying one or more program pulses (e.g., voltage or current pulses) with a particular polarity to cause the storage element 302 to be in the desired stable state. In one embodiment, the access circuitry 342 applies program pulses to the access lines 304, 306 (which may correspond to a bitline and a wordline) to write to or read the memory cell 300. In one embodiment, to write to the memory cell 300, the access circuitry applies one or more program pulses with particular magnitudes, polarities, and pulse widths to the access lines 304, 306 to program the memory cell 300 to the desired stable state, which can both select memory cell 300 and program memory cell 300. In various embodiments below, programming states are depicted as being associated with a single programming pulse, however, the single programming pulse may also be equivalent to a series of programming pulses that have the effective characteristics of the single programming pulse (e.g., a width of the single programming pulse may be equivalent to the sum of the widths of a series of shorter programming pulses).

In one embodiment, programming the memory cell 300 causes the memory cell 300 to "threshold" or undergo a "threshold event." When a memory cell thresholds (e.g., during application of a program pulse), the memory cell undergoes a physical change that causes the memory cell to exhibit a certain threshold voltage in response to the application of a subsequent voltage (e.g., through application of a read pulse with a particular voltage magnitude and polarity). Programming the memory cell 300 can therefore involve applying a program pulse of a given polarity and application of current for a duration of time, which causes the memory cell 300 to exhibit a particular threshold voltage at a subsequent reading voltage of a same or different polarity. In one such embodiment, the storage element 302 is a self-selecting material that can be programmed by inducing a threshold event.

Access circuitry 342 may write to or read a memory cell 300 by applying one or more pulses having a particular magnitude, pulse width, and polarity to the terminals (e.g., electrodes 308, 310) of the memory cell. The amplitude or width of a program pulse can vary depending on implementation. The pulse polarity may be positive or negative.

During a read operation, access circuitry 342 may determine a threshold voltage of a memory cell based on electrical responses to a read voltage applied to the memory cell. Detecting electrical responses can include, for example, detecting a voltage drop (e.g., a threshold voltage) across terminals of a given memory cell of the array or current through the given memory cell. In some cases, detecting a threshold voltage for a memory cell can include determining that the cell's threshold voltage is lower than or higher than a reference voltage, for example a read voltage. The access circuitry 342 can determine the logic state of the memory cell 300 based on the electrical response of the memory cell to the read voltage pulse.

As mentioned above, the access lines 304, 306 electrically couple the memory cell 300 with circuitry 342. The access lines 304, 306 can be referred to as a bitline and wordline, respectively. The wordline is for accessing a particular word in a memory array and the bitline is for accessing a particular bit in the word. The access lines 304, 306 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 308 are disposed between storage element 302 and access lines 304, 306. Electrodes 308 electrically couple access lines 304, 306 to storage element 302. Electrodes 308 can be composed of one or more conductive and/or semiconductive materials such as, for example: carbon (C), carbon nitride ($C_xN_y$); n-doped polysilicon and p-doped polysilicon; metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials.

In one embodiment, conductive wordline or bitline layer can include any suitable metal including, for example, metals including, Al, Cu, Ni, Mo, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

The memory cell 300 is one example of a memory cell that may be used to store one or more logical bits. Other embodiments can include memory cells having additional or different layers of material than illustrated in FIG. 3 (e.g., a selection device between the access line 304 and the storage element, a thin dielectric material between the storage material and access lines, another electrode (comprising any of the materials listed above or other suitable material) between a storage element and a select device, or other suitable configuration).

FIG. 4 is a perspective view of portions of a 3D crosspoint memory stack according to one embodiment. The specific layers are merely examples and will not be described in detail here. Stack 400 is built on substrate structure 422, such as silicon or other semiconductor. Stack 400 includes multiple pillars 420 as memory cell stacks of memory cells 207 or 300. In the diagram of stack 400, it will be observed that the WLs and BLs are orthogonal to each other, and traverse or cross each other in a cross-hatch pattern. A crosspoint memory structure includes at least one memory cell in a stack between layers of BL and WL. As illustrated, wordlines (WL) 215 are in between layers of elements, and bitlines (BL) 217 are located at the top of the circuit. Such a configuration is only an example, and the BL and WL structure can be swapped. Thus, in one representation of stack 400, the WLs can be the metal structures labeled as 217, and the BLs can be the metal structures labeled as 215. Different architectures can use different numbers of stacks of devices, and different configuration of WLs and BLs. It will be understood that the space between pillars 420 is typically an insulator.

Substrate structure 422, such as a silicon substrate, may include control circuitry therein (not shown), such as control circuitry including transistors, row decoders, page buffers, etc. The control circuitry of substrate structure 422 may include, for example, a memory partition controller such as memory partition controller 210, BL control logic such as BL control logic 216, and WL control logic such as WL control logic 214 of FIG. 2, access circuitry 342, or other suitable control circuitry. Each row of WLs 215 extending in the Y direction, the corresponding cells as coupled to corresponding BLs, would define a memory array, and may correspond to a memory array such as memory array 206 of FIG. 2.

FIG. 5 is a cross section view of a portion of a memory array in accordance with certain embodiments. FIG. 5 includes a memory cell 500 coupled to a wordline (WL) 516 (the memory cell 500 may also be coupled to a bitline above the memory cell, though the bitline is not shown). The memory cell 500 comprises a storage element 504 coupled between a top electrode 502 and a middle electrode 506, and a selector device 508 coupled between the middle electrode 506 and a bottom electrode 510. In the embodiment depicted, an ohmic contact layer 512A couples the top electrode 502 to the storage element 504, an ohmic contact layer 512B couples the storage element 504 to the middle electrode 506, and a ballast layer couples the bottom electrode 510 to WL 516. In various embodiments, other layers may be present or some of the layers may be omitted. For example, FIG. 5 also depicts a nitride hardmask 518, which may be formed prior to formation of the encapsulating bilayer, but may be removed later in the fabrication process, e.g., to expose the top electrode for coupling to a bitline.

In some embodiments, the bitline coupled to the memory cell may be coupled to a first portion of a metal layer (e.g., through one or more vias) while wordline 516 may be coupled to a second portion of the metal layer through a separate via (or vias). The metal layer may comprise any number of discrete interconnects (e.g., various interconnects for bitlines, other interconnects for wordlines, etc.). In various embodiments, interconnects of metal layer may be coupled to one or more additional interconnects of lower metal layers through respective vias and may also be coupled to access circuitry, control circuitry, and/or sense circuitry.

An ohmic contact layer 512 (e.g., 512A or 512B) may facilitate improved ohmic contact between an electrode and another layer. For example, ohmic contact layer 512A may improve the contact between the top electrode 502 and the storage element 504 while ohmic contact layer 512B may improve the contact between the middle electrode 506 and the storage element 504. In one embodiment, an ohmic contact layer 512 comprises a tungsten (or other metallic) lamella.

Storage element 504 may comprise any suitable material to store data, such as any of the storage materials described herein (e.g., with respect to storage element 302), such as a phase change material. In various embodiments, storage element 504 comprises a chalcogenide material.

Selector device 508 may comprise any suitable select device described herein, such as an ovonic threshold switch, diode, bipolar junction transistor, field-effect transistor, etc. In some embodiments, the select device 508 may be heated (e.g., by application of current through the bottom electrode 510) to an appropriate temperature to cause the appropriate current, voltage, and/or temperature to be applied to the storage element 504 during operation. In some embodiments, the storage element 504 is heated to a temperature that is higher than the temperature to which the select device 508 is heated. In some embodiments, the selector device 508 may also store data (e.g., based on whether the selector device has a relatively high or low threshold voltage). In various embodiments, storage element 504 comprises a chalcogenide material (which may comprise the same material or a different material from the material of storage element 504).

The middle electrode 506 may heat the storage element 504 and the top electrode may conductively couple the storage element to the corresponding bitline. In various embodiments, any of the electrodes may comprise any suitable electrode material described herein (such as the materials described above in connection with electrodes 308 and 310). In some embodiments, such electrodes may comprise a carbon film or a carbon nitride film.

The ballast layer 514 may help control the amount of current that flows through the bottom electrode 510, e.g., when a current pulse is applied to the memory cell 500 (e.g., the ballast layer 514 may prevent or mitigate current overshoot and/or read disturb issues). In one embodiment, the ballast layer 514 may comprise WSiN.

Figure 6:
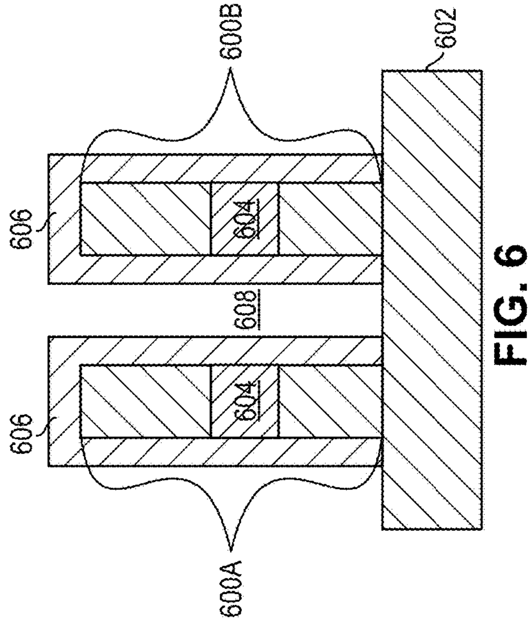
FIG. 6 illustrates ideal encapsulation of memory cells in accordance with certain embodiments.

FIG. 6 illustrates ideal encapsulation of memory cells 600 (e.g., 600A and 600B) in accordance with certain embodiments. In one embodiment, a memory cell 600 may have any of the characteristics of memory cell 500 (or other memory cell, such as those described herein). In other embodiments, the encapsulation layer described herein may be formed around any other suitable device (e.g., a thermo-electric device comprising chalcogenide) that may benefit from being encapsulated. In the embodiment depicted, the memory cell comprises a storage element 604. Additional elements (e.g., elements shown in FIG. 5) of the stack of the memory cell 600 are not depicted in detail. The memory cells 600 are coupled to an access line 602 (such as a wordline or a bitline).

FIG. 6 depicts ideal encapsulation layers 606 formed around individual memory cells 600. The ideal encapsulation layer 606 has a uniform thickness at the top of the memory cell 600 and the left and right sides of the memory cell 600. This results in an encapsulation layer 606 with ideal conformality with respect to the shape of the memory cell 600. After the encapsulation layer 606 is formed, a thin oxide (e.g., applied using ALD or other method) and/or a gap fill material (e.g., a spin-on dielectric) may be placed in a void 608 formed between the memory cells 600A and 600B. The structures shown in FIGS. 6-9 may be repeated for any number of memory cells of a memory array.

Figure 7:
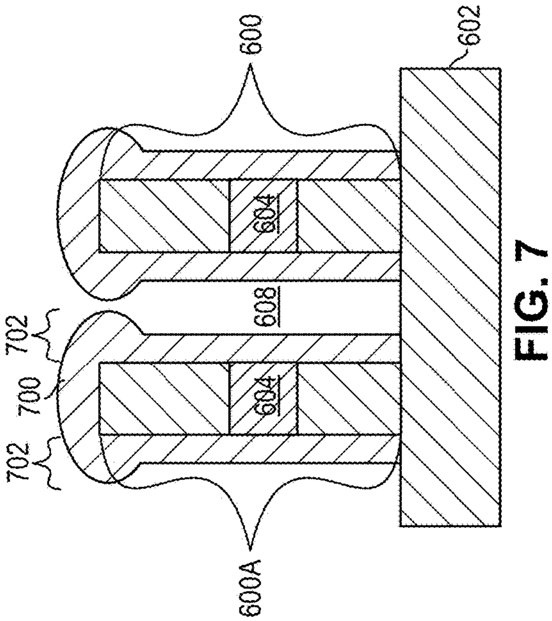
FIG. 7 illustrates encapsulation of memory cells with excessive overhang in accordance with certain embodiments.

FIG. 7 illustrates encapsulation of memory cells 600 with excessive encapsulation layer overhang in accordance with certain embodiments. In FIG. 7, an encapsulation layer 700 does not have ideal conformality due in part to portions 702 near the top of the encapsulation layer 700 that overhang past the sides of the memory cell 600 due to excessive deposition at the top of the memory cell 600. For example, if the thickness of the encapsulation layer at a point on the side of the memory cell (e.g., at the selector device or other suitable portion of the memory cell stack) is 35 angstroms and the thickness at the top of that side of the memory cell is 70 angstroms, the overhang may be defined as 2× the target thickness. Excessive overhang of the encapsulation layer 700 may hinder the formation of the gap fill material in the void 608, especially as the distance between memory cells decreases. The non-ideal encapsulation layer 700 may result from usage of a deposition method (e.g., a certain type of CVD) that results in relatively low conformality of the encapsulation layer 700.

Figure 8:
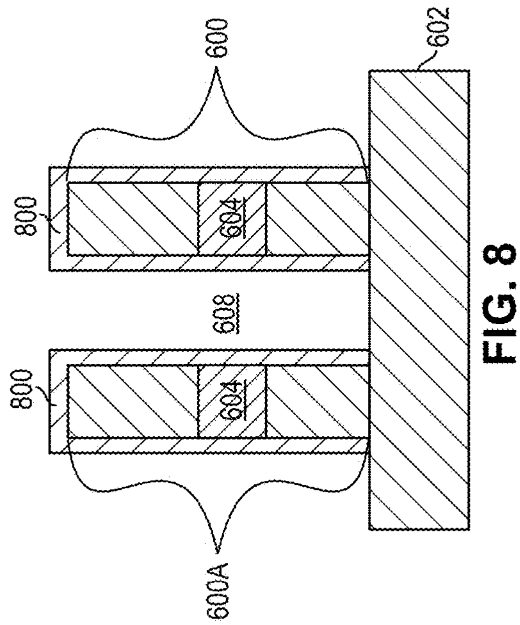
FIG. 8 illustrates inner layers for encapsulation of memory cells in accordance with certain embodiments.
Figure 9:
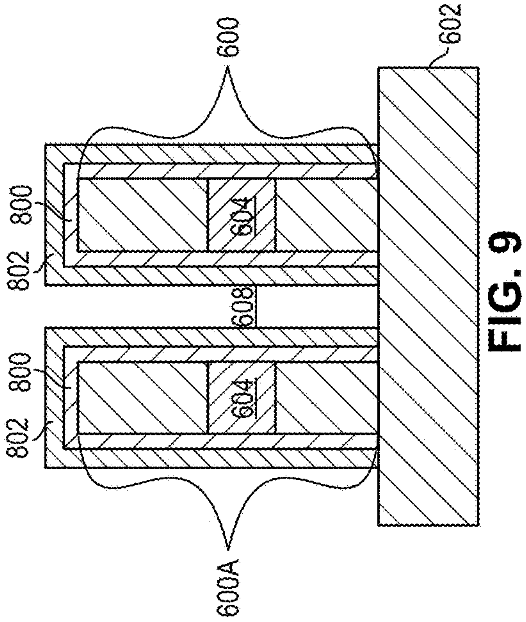
FIG. 9 illustrates bilayers for encapsulation of memory cells in accordance with certain embodiments.

FIGS. 8-9 illustrate formation of an encapsulating bilayer that more closely approaches the ideal encapsulation layer. FIG. 8 illustrates thin protective inner layers 800 for encapsulation of memory cells 600 in accordance with certain embodiments. The inner layer 800 may be applied using any suitable deposition method, such as CVD (e.g., PECVD) or ALD (e.g., thermal ALD). In one embodiment, the inner layer 800 is applied through pulsed PECVD, utilizing suitable SiN precursors, such as silane and ammonia at a temperature that is between 100° and 380° C. The inner layer 800 may cover and protect the top and both sides of memory cell 600. Because the inner layer 800 is relatively thin, the conformality requirements for the inner layer 800 may be slightly relaxed since the inner layer will not significantly affect the total conformality of the encapsulating bilayer. The inner layer 800 may be thin enough to preserve sufficient conformality of the overall bilayer, but thick enough to protect the memory cell 600 from the process used to form the outer layer of the bilayer.

In various embodiments, the inner layer comprises a nitride, such as silicon nitride, or an oxide (e.g., a metal oxide), such as silicon dioxide, hafnium oxide or aluminum oxide.

FIG. 9 illustrates bilayers for encapsulation of memory cells 600 in accordance with certain embodiments. The outer layer 802 of the bilayer (where the bilayer also includes the inner layer 800) may be applied using a process that results in suitable overall conformality of the bilayer, such as PEALD. In various embodiments, PEALD (or other suitable deposition process) may be used at a temperature that is between 100° and 380° C. In one embodiment, the temperature at which the deposition process takes place may be roughly 250° C. During formation of the outer layer, the inner layer protects the memory cell from the effects of the deposition process (e.g., PEALD).

In various embodiments, the outer layer of the bilayer comprises a nitride, such as SiN. In other embodiments, the outer layer of the bilayer comprises an oxide, such as aluminum oxide. In some embodiments, the outer layer 802 may comprise the same material as the inner layer 800.

After the bilayers comprising layers 800 and 802 are formed, a thin oxide (e.g., applied using ALD or other method) and/or a gap fill material (e.g., a spin-on dielectric) may be placed in the void 608 formed between the memory cells.

The inner and outer layers may have any suitable thicknesses. The thickness of either layer may vary along the portion of the perimeter of the memory cell (e.g., the left side, top, and right side) on which the bilayer is formed. For example, the average thickness of the inner layer 800 along the top of the memory cell may be larger (e.g., more than 1% larger, more than 5% larger, etc.) than the average thickness of the inner layer 800 on either side of the memory cell. In one embodiment, the inner layer 800 is thinner than the outer layer 802 (e.g., an average thickness along the portion of the perimeter may be smaller for the inner layer than for the outer layer). In various embodiments, the average thickness of the inner layer 800 may be between 10 and 30 angstroms and the average thickness of the outer layer 802 may be between 20 to 60 angstroms. In various examples, the average thickness of the inner layer 800 is less than 75% or less than 50% of the average thickness of the outer layer 802.

While the bilayer is depicted in FIG. 9 as having a uniform width along each side, practical implementations will generally result in some amount of overhang greater in width than the width of the bilayer at lower points along the sides. However, in various embodiments, the overhang of the bilayer is less than 1.5×the target bilayer thickness (e.g., the thickness of the bilayer at a specific point on the side of the memory cell below the top of the memory cell, such as at the selector device). In some embodiments, the overhang of the bilayer is less than about 1.2×the target bilayer thickness.

In various embodiments, the trenches formed in between the memory cell stacks before the bilayer is formed may have any suitable height to width ratio (where the width is the distance from the side of one memory cell stack to the adjacent side of another memory cell stack), such as a ratio greater than 6:1. The width of the trenches (e.g., as measured from one side of the nitride hardmask of one memory cell stack to the adjacent side of the nitride hardmask of an adjacent memory cell stack) may be any suitable width, such as less than 30 nm (as various embodiments may be particularly suited for use with trenches having small widths).

Figure 10:
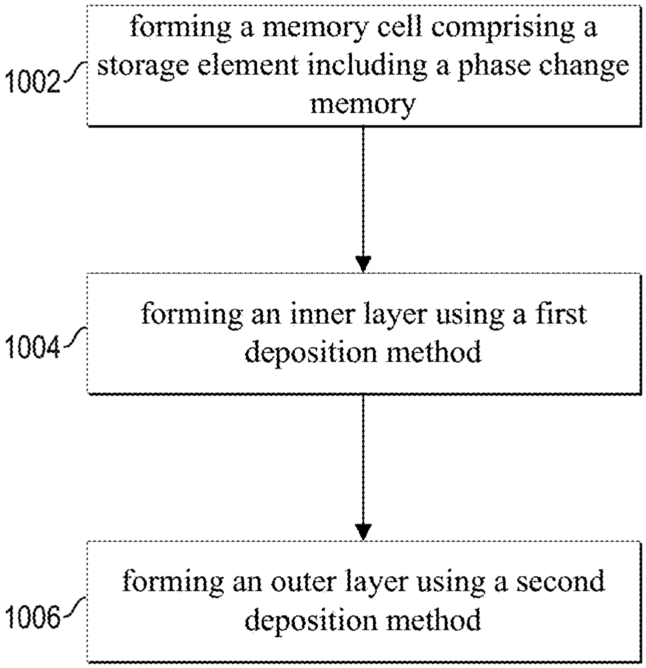
FIG. 10 illustrates a flow for encapsulating a memory cell in accordance with certain embodiments.

FIG. 10 is a flow for forming portions of a memory in accordance with certain embodiments. At 1002, a memory cell comprising a storage element including a phase change memory is formed. At 1004, a first deposition method is used to form an inner layer. At 1006, a second deposition method is used to form an outer layer.

Figure 11:
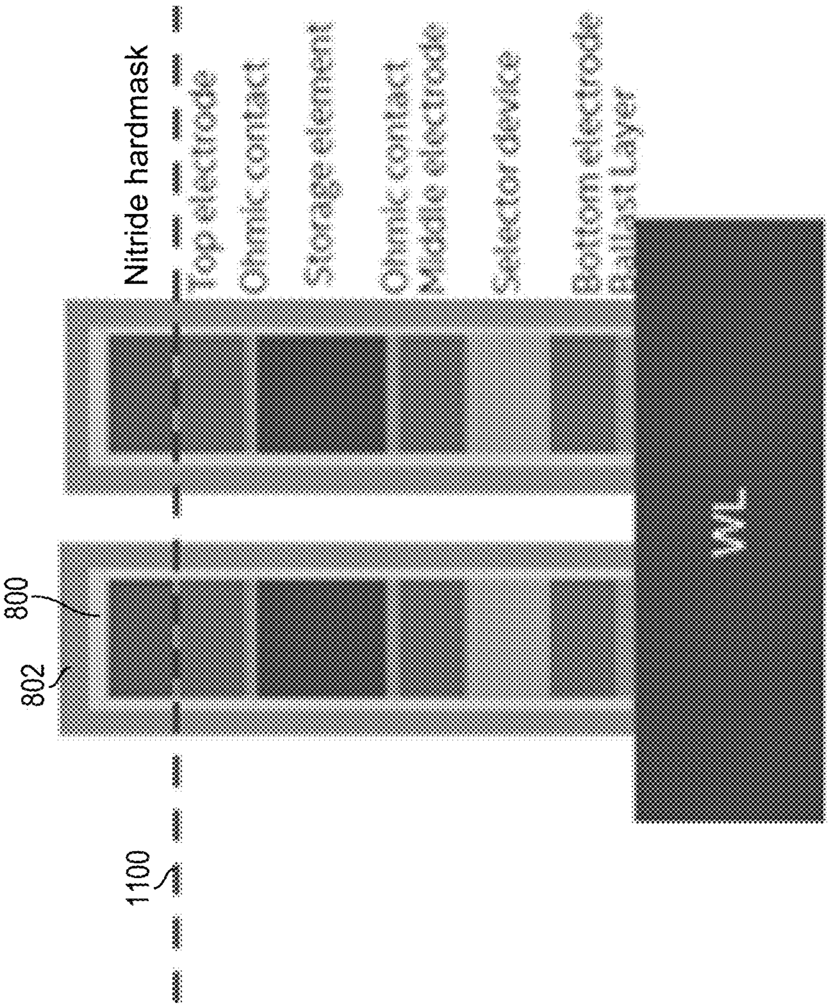
FIG. 11 illustrates bilayers for encapsulation of memory cells in accordance with certain embodiments.

In some embodiments, the flow may also include removing a portion of the bilayer. For example, in FIG. 11, two memory cells along with respective encapsulating bilayers are depicted. After the bilayers are formed (and potentially after a dielectric is formed in the gap between the memory cells), the portions of the bilayers and the memory cells (e.g., the nitride hardmasks or other material on top of the top electrode) that are above line 1100 may be removed in order to form the bitline which will be in contact with the top electrode.

Although some of the examples discussed with respect to FIGS. 5-11 are directed to encapsulation of memory cells of a 3D crosspoint array, the features described herein may be utilized in any suitable memory architecture (e.g., chalcogenide-based non-volatile memory devices) or other electronics architecture which utilize devices that need protection from subsequent microfabrication steps. For example, material systems with physical/chemical restraints that may benefit from application of the bilayer encapsulation may include oxygen/moisture/atmosphere-sensitive active devices and/or devices that are sensitive to plasma damage. The dimensions of devices in which the bilayer encapsulation is used may be very small.

The flows described herein are merely representative of operations that may occur in particular embodiments. Some of the operations illustrated in the FIGS. may be repeated, combined, modified, or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable storage medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory chip 116, storage device controller 118, address translation engine 120, memory partition 122, program control logic 124, chip controller 126, memory partition controller 210, wordline control logic 214, bitline control logic 216, WL switch circuitry 220, BL switch circuitry 224, access circuitry 342, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, e.g., reset, while an updated value potentially includes a low logical value, e.g., set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (e.g., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a The machine-readable storage medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Example 1 includes a memory device comprising a memory cell comprising a storage element including a phase change memory; and a bilayer formed on a first side and a second side of the memory cell, the bilayer including an inner layer comprising a first nitride and an outer layer comprising a second nitride.

Example 2 includes the subject matter of Example 1, and wherein the first nitride is silicon nitride and the second nitride is silicon nitride.

Example 3 includes the subject matter of any of Examples 1 and 2, and further including a dielectric material between a side of the bilayer and a side of a second bilayer encapsulating a second memory cell adjacent to the memory cell.

Example 4 includes the subject matter of any of Examples 1-3, and wherein the storage element comprises a chalcogenide material.

Example 5 includes the subject matter of any of Examples 1-4, and wherein the inner layer has an average thickness that is less than an average thickness of the outer layer.

Example 6 includes the subject matter of any of Examples 1-5, and wherein the inner layer has an average thickness of between 10 and 30 angstroms.

Example 7 includes the subject matter of any of Examples 1-6, and wherein the outer layer has an average thickness of between 20 to 50 angstroms.

Example 8 includes the subject matter of any of Examples 1-7, and wherein a conformality exhibited by the outer layer is higher than a conformality exhibited by the inner layer.

Example 9 includes the subject matter of any of Examples 1-8, and wherein an overhang thickness of a top portion of the bilayer that extends past the first side of the memory cell is less than 1.5 times a thickness of the bilayer on the first side of the memory cell at a selector device of the memory cell.

Example 10 includes the subject matter of any of Examples 1-9, and wherein an average thickness of the inner layer is greater towards the top of the memory cell than along the first side or second side of the memory cell.

Example 11 includes the subject matter of any of Examples 1-10, and further including a plurality of memory chips, wherein a memory chip of the plurality of memory chips comprises the memory cell.

Example 12 includes the subject matter of any of Examples 1-11, and further including a memory controller to communicate with the plurality of memory chips.

Example 13 includes the subject matter of any of Examples 1-12, and wherein the memory device comprises a solid state drive.

Example 14 includes the subject matter of any of Examples 1-12, wherein the memory device comprises a dual in-line memory module.

Example 15 includes a method comprising forming a memory cell comprising a storage element including a phase change memory; forming a bilayer encapsulating the memory cell on a first side, a top, and a second side of the memory cell, wherein forming the bilayer comprises forming an inner layer using a first deposition method; and forming an outer layer using a second deposition method.

Example 16 includes the subject matter of Example 15, and wherein the first deposition method includes plasma enhanced chemical vapor deposition (PECVD) and the second deposition method includes plasma enhanced atomic layer deposition (PEALD).

Example 17 includes the subject matter of any of Examples 15 and 16, and wherein the outer layer is thicker than the inner layer.

Example 18 includes the subject matter of any of Examples 15-17, and wherein the inner layer and outer layer both comprise silicon nitride.

Example 19 includes the subject matter of any of Examples 15-18, and further including removing a top portion of the bilayer in order to expose a top electrode of the memory cell.

Example 20 includes the subject matter of any of Examples 15-19, and wherein the inner layer comprises silicon nitride and the outer layer comprises silicon nitride.

Example 21 includes the subject matter of any of Examples 15-20, and further including forming a dielectric material between a side of the bilayer and a side of a second bilayer encapsulating a second memory cell adjacent to the memory cell.

Example 22 includes the subject matter of any of Examples 15-21, and wherein the storage element comprises a chalcogenide material.

Example 23 includes the subject matter of any of Examples 15-22, and wherein the inner layer has an average thickness that is less than an average thickness of the outer layer.

Example 24 includes the subject matter of any of Examples 15-23, and wherein the inner layer has an average thickness of between 10 and 30 angstroms.

Example 25 includes the subject matter of any of Examples 15-24, and wherein the outer layer has an average thickness of between 20 to 50 angstroms.

Example 26 includes the subject matter of any of Examples 15-25, and wherein a conformality exhibited by the outer layer is higher than a conformality exhibited by the inner layer.

Example 27 includes the subject matter of any of Examples 15-26, and wherein an overhang thickness of a top portion of the bilayer that extends past the first side of the memory cell is less than 1.5 times a thickness of the bilayer on the first side of the memory cell at a selector device of the memory cell.

Example 28 includes the subject matter of any of Examples 15-27, and wherein an average thickness of the inner layer is greater towards the top of the memory cell than along the first side or second side of the memory cell.

Example 29 includes the subject matter of any of Examples 15-28, and further including forming a plurality of memory chips, wherein a memory chip of the plurality of memory chips comprises the memory cell.

Example 30 includes the subject matter of any of Examples 15-29, and further including forming a memory controller to communicate with the plurality of memory chips.

Example 31 includes the subject matter of any of Examples 15-30, and wherein the memory cell is a memory cell of a solid state drive.

Example 32 includes the subject matter of any of Examples 15-30, wherein the memory cell is a memory cell of a dual in-line memory module.

Example 33 includes a system comprising a memory chip comprising a memory array comprising a plurality of memory cells, wherein a memory cell comprises a storage element including a phase change memory; and a plurality of bilayers, wherein a bilayer is formed on a first side and a second side of the memory cell, the bilayer including an inner layer comprising a first nitride and an outer layer comprising a second nitride.

Example 34 includes the subject matter of Example 33, and further including a second memory chip and a controller coupled to the memory chip and the second memory chip.

Example 35 includes the subject matter of any of Examples 33 and 34, and further including a processor to generate data to be stored by the memory array, the processor to couple to the memory chip through a storage device controller of a storage drive comprising the memory chip.

Example 36 includes the subject matter of any of Examples 33-35, and further including one or more of a battery communicatively coupled to the processor, a display communicatively coupled to the processor, or a network interface communicatively coupled to the processor.

Example 37 includes the subject matter of any of Examples 33-36, and wherein the first nitride is silicon nitride and the second nitride is silicon nitride.

Example 38 includes the subject matter of any of Examples 33-37, and further including a dielectric material between a side of the bilayer and a side of a second bilayer encapsulating a second memory cell adjacent to the memory cell.

Example 39 includes the subject matter of any of Examples 33-38, and wherein the storage element comprises a chalcogenide material.

Example 40 includes the subject matter of any of Examples 33-39, and wherein the inner layer has an average thickness that is less than an average thickness of the outer layer.

Example 41 includes the subject matter of any of Examples 33-40, and wherein the inner layer has an average thickness of between 10 and 30 angstroms.

Example 42 includes the subject matter of any of Examples 33-41, and wherein the outer layer has an average thickness of between 20 to 50 angstroms.

Example 43 includes the subject matter of any of Examples 33-42, and wherein a conformality exhibited by the outer layer is higher than a conformality exhibited by the inner layer.

Example 44 includes the subject matter of any of Examples 33-43, and wherein an overhang thickness of a top portion of the bilayer that extends past the first side of the memory cell is less than 1.5 times a thickness of the bilayer on the first side of the memory cell at a selector device of the memory cell.

Example 45 includes the subject matter of any of Examples 33-44, and wherein an average thickness of the inner layer is greater towards the top of the memory cell than along the first side or second side of the memory cell.

Example 46 includes the subject matter of any of Examples 33-45, and further including a plurality of memory chips.

Example 47 includes the subject matter of any of Examples 33-46, and further including a memory controller to communicate with the plurality of memory chips.

Example 48 includes the subject matter of any of Examples 33-47, and wherein the memory chip is a memory chip of a solid state drive.

Example 49 includes the subject matter of any of Examples 33-48, and wherein the memory chip is a memory chip of a a dual in-line memory module.

What is claimed is:

1. A memory device comprising:

a memory cell comprising a storage element including a phase change memory; and a bilayer formed on a first side and a second side of the memory cell, the bilayer including an inner layer comprising a first nitride and an outer layer comprising a second nitride;

a second memory cell adjacent to the memory cell, the second memory cell comprising a second storage element including the phase change memory;

a second bilayer formed on a first side and a second side of the second memory cell, the second bilayer including an inner layer comprising the first nitride and an outer layer comprising the second nitride; and at least one dielectric material between the outer layer of the bilayer and the outer layer of the second bilayer.

2. The memory device of claim 1, wherein the first nitride is silicon nitride and the second nitride is silicon nitride, wherein the second nitride of the outer layer is deposited directly on the first nitride of the inner layer.

3. The memory device of claim 1, wherein the at least one dielectric material formed between the outer layer of the bilayer and the outer layer of the second bilayer comprises an oxide and a spin-on dielectric material.

4. The memory device of claim 1, wherein the at least one dielectric material fills a trench between an outer layer of the bilayer and an adjacent outer layer of the second bilayer and wherein a width of the at least one dielectric material formed between the outer layer of the bilayer and the outer layer of the second bilayer is less than 30 nanometers.

5. The memory device of claim 1, wherein the inner layer has an average thickness that is less than an average thickness of the outer layer.

6. The memory device of claim 1, wherein the inner layer has an average thickness of between 10 and 30 angstroms.

7. The memory device of claim 1, wherein the outer layer has an average thickness of between 20 to 50 angstroms.

8. The memory device of claim 1, wherein a conformality exhibited by the outer layer is higher than a conformality exhibited by the inner layer.

9. The memory device of claim 1, wherein an overhang thickness of a top portion of the bilayer that extends past the first side of the memory cell is less than 1.5 times a thickness of the bilayer on the first side of the memory cell at a selector device of the memory cell.

10. The memory device of claim 1, wherein an average thickness of the inner layer is greater towards a top of the memory cell than along the first side or second side of the memory cell.

11. The memory device of claim 1, further comprising a plurality of memory chips, wherein a memory chip of the plurality of memory chips comprises the memory cell.

12. The memory device of claim 11, further comprising a memory controller to communicate with the plurality of memory chips.

13. The memory device of claim 1, wherein the memory device comprises a solid state drive.

14. The memory device of claim 1, wherein the memory device comprises a dual in-line memory module.

15. A system comprising:

a memory chip comprising:

a memory array comprising:

a plurality of memory cells, wherein a memory cell comprises a storage element including a phase change memory;

a plurality of bilayers, wherein a bilayer is formed on a first side and a second side of the memory cell, the bilayer including an inner layer comprising a first nitride and an outer layer comprising a second nitride; and at least one dielectric material between the outer layer of a bilayer of a first memory cell and the outer layer of a bilayer of a second memory cell that is adjacent to the first memory cell.

16. The system of claim 15, further comprising a second memory chip and a controller coupled to the memory chip and the second memory chip.

17. The system of claim 15, further comprising a processor to generate data to be stored by the memory array, the processor to couple to the memory chip through a storage device controller of a storage drive comprising the memory chip.

18. The system of claim 17, further comprising one or more of: a battery communicatively coupled to the processor, a display communicatively coupled to the processor, or a network interface communicatively coupled to the processor.

19. A method comprising:

forming a memory cell comprising a storage element including a phase change memory; forming a bilayer formed on a first side and a second side of the memory cell, the bilayer including an inner layer comprising a first nitride and an outer layer comprising a second nitride;

forming a second memory cell comprising a second storage element including the phase change memory;

forming a second bilayer formed on a first side and a second side of the second memory cell, the second bilayer including an inner layer comprising the first nitride and an outer layer comprising the second nitride; and forming at least one dielectric material between the outer layer of the bilayer and the outer layer of the second bilayer.

20. The method of claim 19, wherein the at least one dielectric material comprises an oxide and a spin-on dielectric material.

21. The method of claim 19, wherein the outer layer is thicker than the inner layer.

22. The method of claim 19, wherein the inner layer and outer layer both comprise silicon nitride, wherein the silicon nitride of the outer layer is deposited on the silicon nitride of the inner layer.

23. The method of claim 19, wherein a dielectric material of the at least one dielectric material is in contact with the outer layer of the bilayer and the outer layer of the second bilayer.

* * * * *